(12) United States Patent
Chien et al.

(10) Patent No.: US 6,432,768 B1
(45) Date of Patent: Aug. 13, 2002

(54) METHOD OF FABRICATING MEMORY DEVICE AND LOGIC DEVICE ON THE SAME CHIP

(75) Inventors: Sun-Chieh Chien; Der-Yuan Wu, both of Hsin-chu (TW)

(73) Assignee: United Microelectronics Corp., Taiwan (TW)

( * ) Notice: Subject to any disclaimer, the term of this patent is extended or adjusted under 35 U.S.C. 154(b) by 0 days.

(21) Appl. No.: 09/510,970

(22) Filed: Feb. 21, 2000

(51) Int. Cl.[7] .......................................... H01L 21/8242
(52) U.S. Cl. ....................................... 438/241; 438/587
(58) Field of Search ................................ 438/241, 239, 438/240, 253–256, 396–399, 266, 301–306, 583, 595, 651–657

(56) References Cited

U.S. PATENT DOCUMENTS 5,998,252 A * 12/1999 Huang .......................... 438/241
6,015,730 A * 1/2000 Wang et al. ................. 438/241
6,069,037 A * 5/2000 Liao ............................. 438/241
6,074,908 A * 6/2000 Huang ......................... 438/241

* cited by examiner

*Primary Examiner*—Caridad Everhart
*Assistant Examiner*—Calvin Lee
(74) *Attorney, Agent, or Firm*—Powell Goldstein Frazer & Murphy LLP

(57) ABSTRACT

A method of fabricating a memory device and a logic device on the same chip is described, wherein the memory device has a first gate on a first region of the chip, and wherein the logic device has a second gate with a sidewall on a second region of the chip. A conductive layer and a first suicide layer are sequentially formed over the first and the second regions of the chip. Over the first region of the chip, the first silicide layer and the conductive layer are patterned to form the first gate. Ions are first implanted into the first region of the chip, by using the first gate as a mask, to form a first doped region. A dielectric layer is formed to cap the first gate, the first doped region and the first region of the chip. The first silicide layer over the second region of the chip is removed. Over the second region of the chip, the conductive layer is patterned to form the second gate. Ions are second implanted into the second region of the chip, by using the second gate as a mask, to form a second doped region.

18 Claims, 6 Drawing Sheets

METHOD OF FABRICATING MEMORY DEVICE AND LOGIC DEVICE ON THE SAME CHIP

BACKGROUND OF THE INVENTION

1. Technical Field

The present invention relates to a semiconductor technology, and particularly to a process of fabricating a memory device and a logic device on the same chip.

2. Description of Related Art

Advanced semiconductor chips, now being manufactured in industry, are composed of logic or memory devices (e.g. DRAM devices). Logic devices are used to process information or data, while memory devices are used for data storage. In systems on which logic and memory devices are formed separately, data signals between the two may have to pass through several levels of packaging, which can result in undesirable propagation delays. For performance and cost reasons the semiconductor industry has been motivated to fabricate logic devices and memory devices on the same chip.

In a chip having DRAM devices and logic circuits thereon, the word lines of the logic circuits are preferable to have a low resistance ($R_s$). To gain the low resistance, a skilled person could form titanium silicide ($TiSi_x$) polycide gate, or forms tungsten/tungsten nitride ($W/WN_x$) metal gate. These processes are not well developed and have many concerns. First, they are too complicated, thereby increasing the cycle time and lowering the yield. Second, they have metal contamination issues.

Another approach to gain the low resistance is to form a self-aligned silicide (salicide, e.g., $TiSi_2$ or $CoSi_2$). However, it will suffer the problem of DRAM performance, because the DRAM devices often have no heavy doped regions for salicidation.

SUMMARY OF THE INVENTION

It is an object of this invention to provide a method of fabricating a memory device and a logic device on a chip.

Other objects and advantages of this invention will become apparent to those of ordinary skill in the art having reference to the following specification in conjunction the drawings.

This present invention provides a method of fabricating a memory device and a logic device on a chip, wherein the memory device has a first gate with a first sidewall, and wherein the logic device has a second gate with a second sidewall. A substrate is provided. A first region of the substrate is provided to be used for the memory device. A second region of the substrate is provided to be used for the logic device. A first dielectric layer, a polysilicon layer, a first silicide layer, and a hard mask layer are sequentially formed over the first and the second regions of the substrate. Over the first region of the substrate, the hard mask layer, the first silicide layer, the polysilicon layer and the first dielectric layer are patterned to form the first gate. Ions are first implanted into the first region of the substrate, by using the first gate as a mask, to form a first doped region. A first spacer is formed on the first sidewall of the first gate. The substrate is partially covered by forming a second dielectric layer to cap the memory device over the first region of the substrate, and to expose the hard mask layer over the second region of the substrate. Over the second region of the substrate, the hard mask layer and the first silicide layer are removed. Over the second region of the substrate, the polysilicon layer is patterned to form the second gate. Ions are second implanted into the second region of the substrate, by using the second gate as a mask, to form a second doped region. A second spacer is formed on the second sidewall of the second gate. Ions are third implanted into the second region of the substrate, by using the second spacer and the second gate as a mask, to form a third doped region deeper than the second doped region. A second suicide layer is grown on the second gate and on the third doped region.

The process of fabricating the memory device is independent from the process of fabricating the logic devices. Moreover, the second spacer can be made of a material different from that of the first spacer. Furthermore, the second spacer may has a thickness different from that of the first spacer. These can be achieved because the first spacer is capped with the second dielectric layer when the second spacer is formed.

BRIEF DESCRIPTION OF THE DRAWINGS

The foregoing versions and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENTS

Figure 1A:
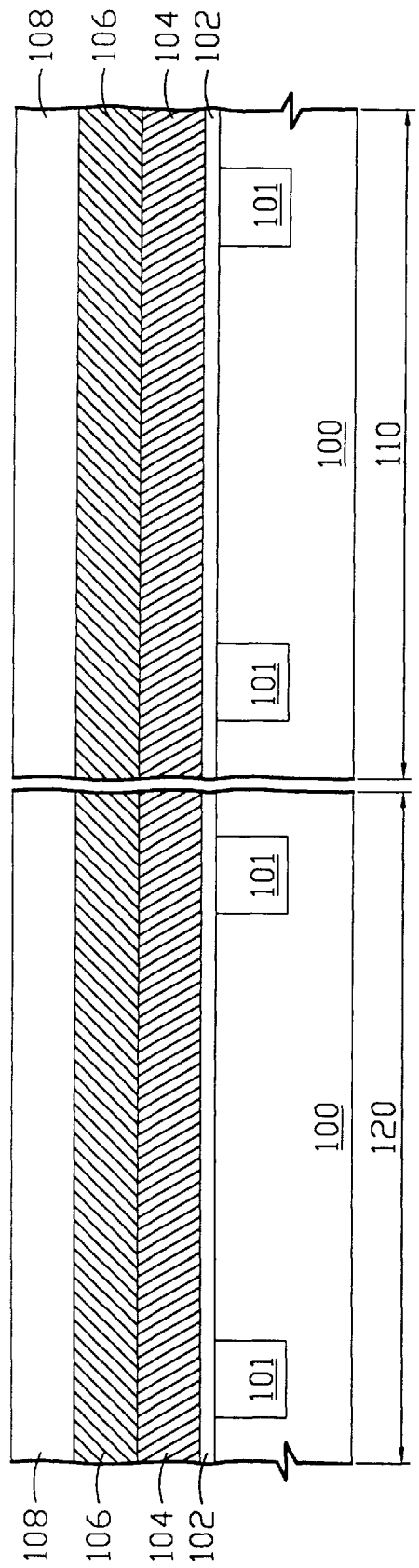
FIG. 1A through FIG. 1F schematically illustrate cross-sectional views of a process of fabricating a memory device and a logic device on a chip.
Figure 1B:
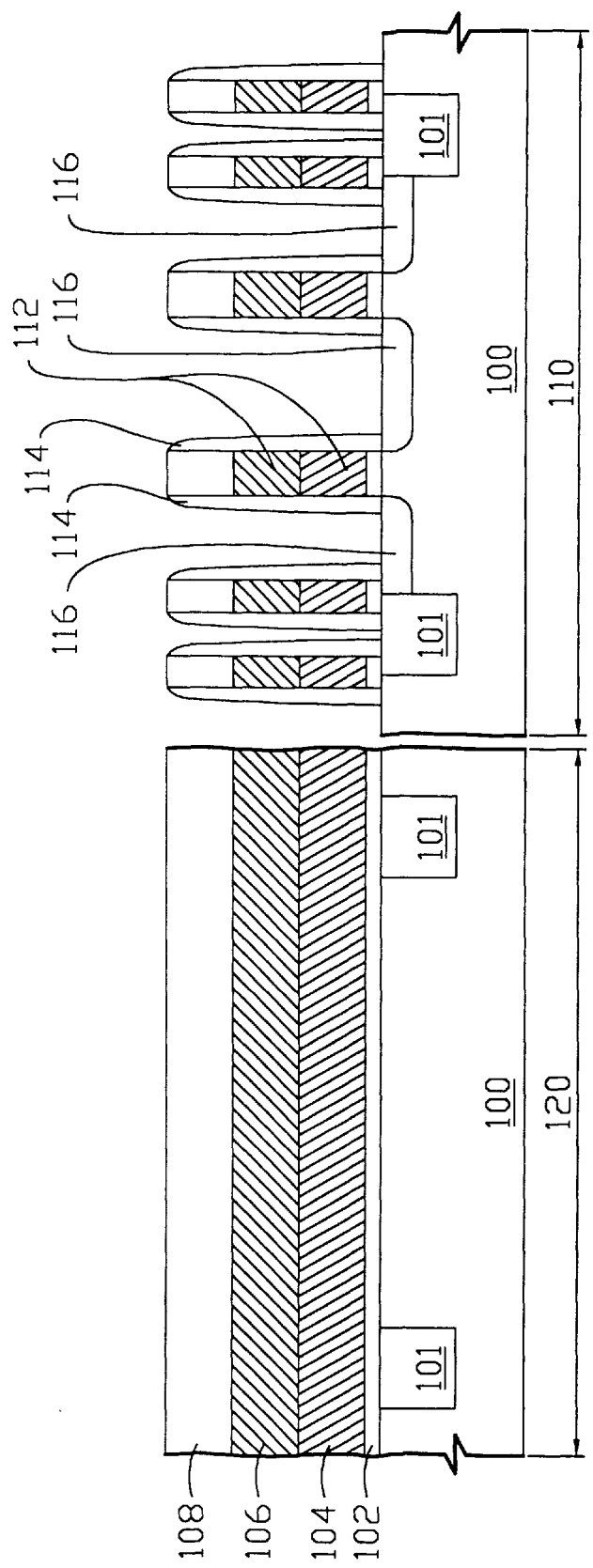
Figure 1C:
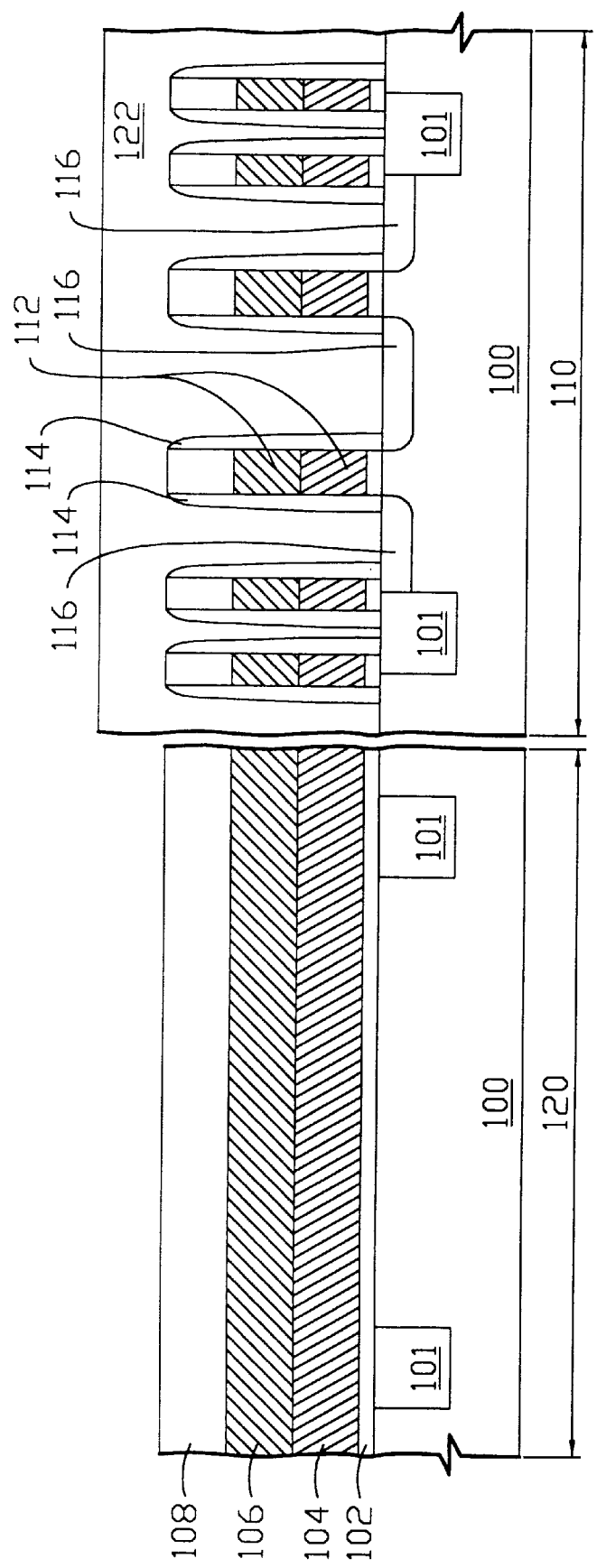
Figure 1D:
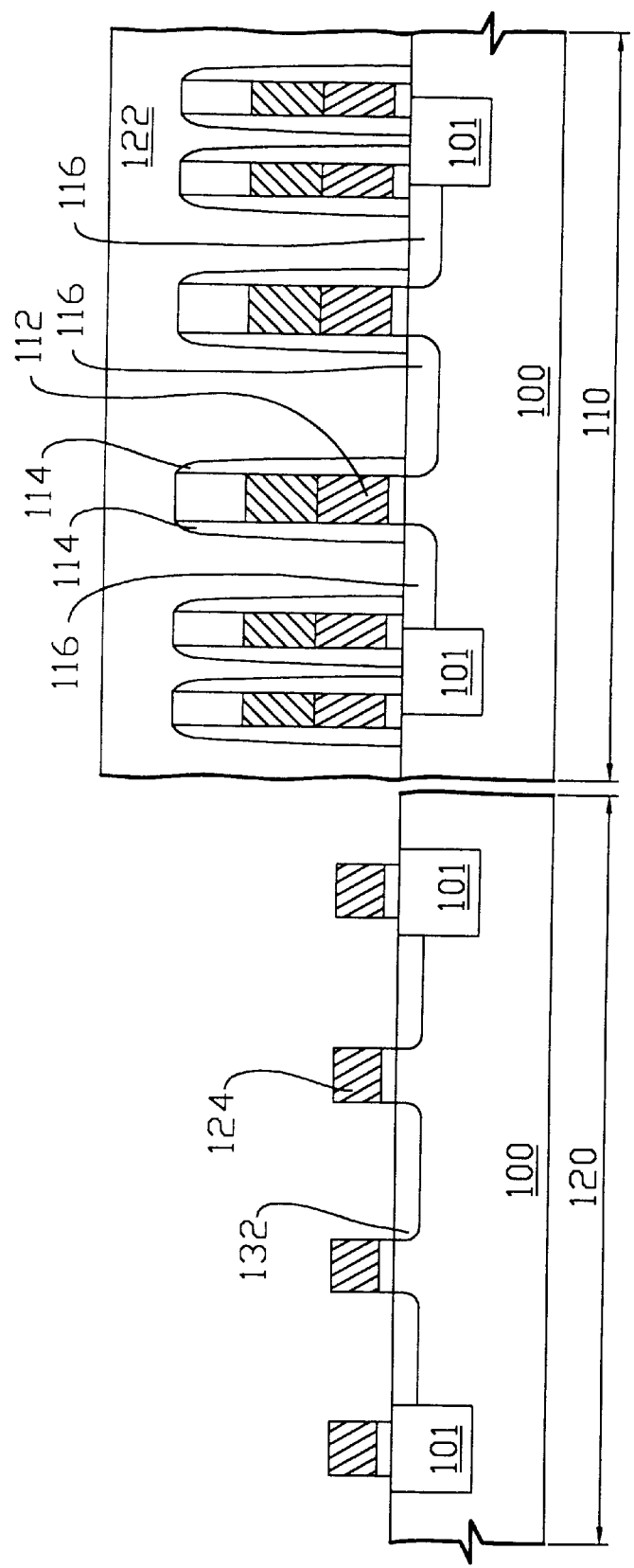
Figure 1E:
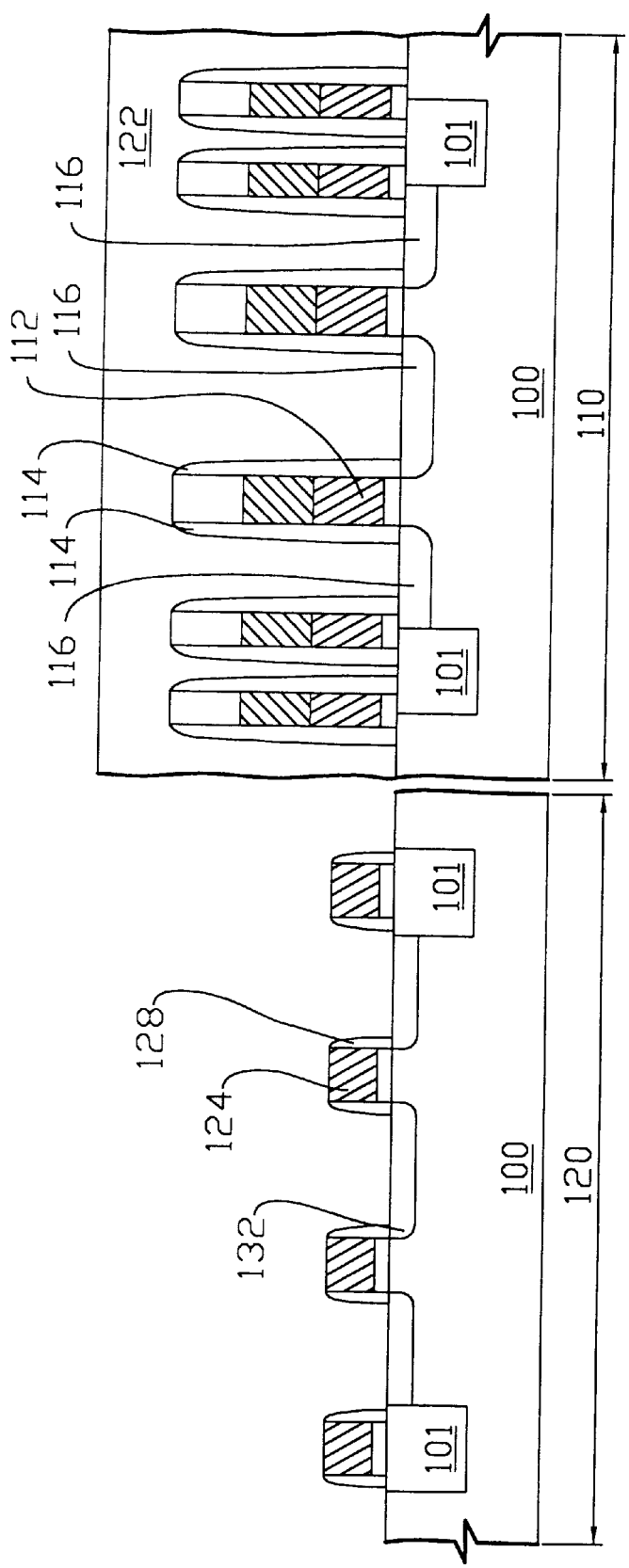
Figure 1F:
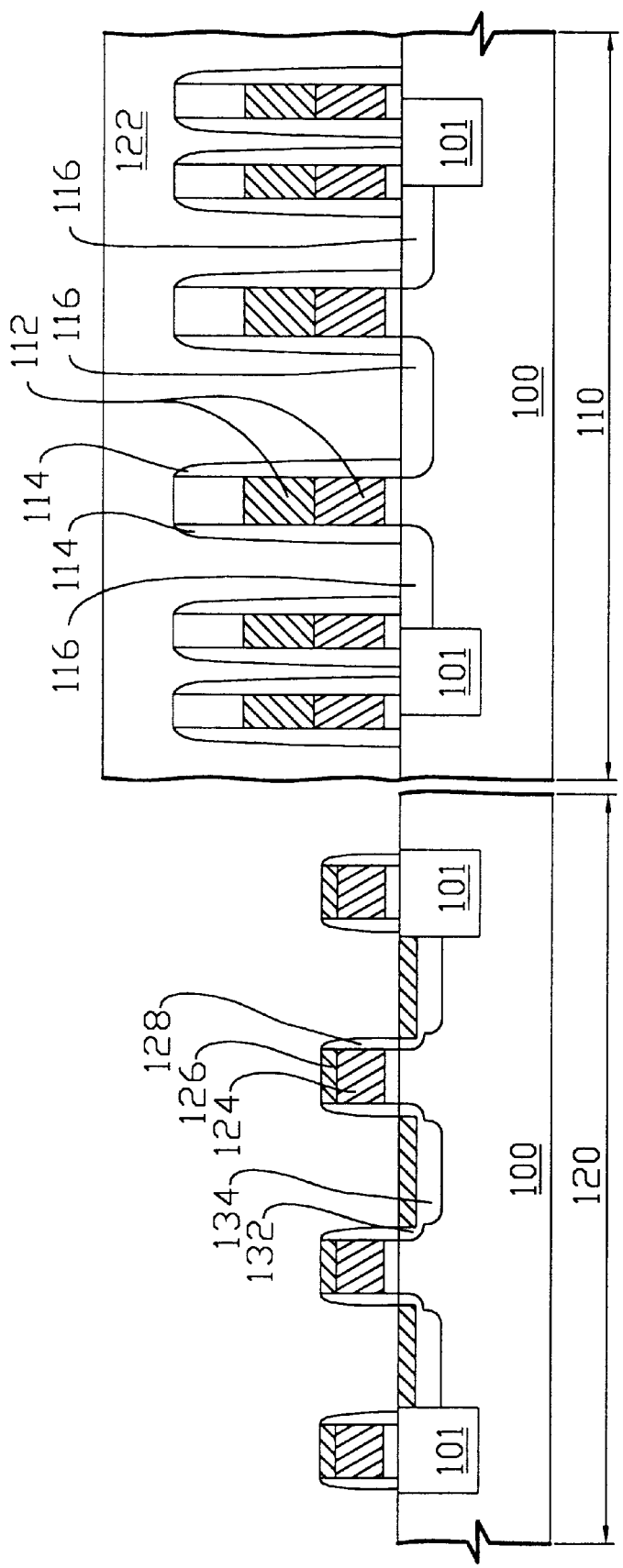

FIG. 1A through FIG. 1F schematically illustrate cross-sectional views of a process of fabricating a memory device and a logic device on a chip. Referring to FIG. 1F, the memory device, such as a dynamic random access memory (DRAM) device, has a first gate 112 with a first sidewall, and wherein the logic device has a second gate 124 with a second sidewall.

Turning to FIG. 1A, a substrate, such as a silicon substrate 100 having shallow trench isolations (STIs) 101, is provided. The substrate 100 has a first region 110 which is used for the memory device, and has a second region 120 which is used for the logic device. A first dielectric layer 102, a conductive layer (e.g. doped polysilicon layer) 104, a first silicide layer 106, and a hard mask layer 108 are sequentially formed over the first and the second regions 110, 120 of the substrate 100. The first silicide layer 106 can be made of tungsten silicide (WSi), while the hard mask layer 108 can be made of silicon nitride (SiN).

Referring to FIG. 1B, over the first region 110 of the substrate 100, the hard mask layer 108, the first silicide layer 106, the polysilicon layer 104 and the first dielectric layer 102 are patterned to form the first gate 112. Thereafter, ions are first implanted into the first region 110 of the substrate 100, by using the first gate 112 as a mask, to form a first lightly doped drain (LDD) 116. After the first implanting step, a first spacer 114 is formed on the first sidewall of the first gate 112.

Referring to FIG. 1C, the substrate 100 is partially covered with a second dielectric layer 122, wherein the second dielectric layer 122 caps the first gate 112, the first LDD 116 and the first spacer 114 over the first region 110 of the substrate 100, and exposes the hard mask layer 108 over the second region 120 of the substrate 100. The second dielectric layer 122 is substantially higher than the first gate 112, thereby being sufficient to protect the first gate 112 and the first LDD 116 in the following process steps. The formation of the second dielectric layer 122 further comprises a step of depositing an oxide layer (not fully shown) over the substrate 100, and a step of patterning the oxide layer to partially removing the oxide layer by lithography and etching. After the oxide layer is partially removed, it leaves a portion 122 capping the first gate 112, the first spacer 114 and the first region 110 of the substrate 100. However, the hard mask layer 108 over the second region 120 of the substrate 100 is still exposed.

Referring to FIG. 1D, over the second region 120 of the substrate 100, the exposed hard mask layer 108 (FIG. 1C) and the first silicide layer 106 (FIG. 1C) are sequentially removed by way of, for example, lithography and etching. After they are removed, the polysilicon layer 104 (FIG. 1C) over the second region 120 of the substrate 100 is patterned to form the second gate 124. Thereafter, ions are second implanted into the second region 120 of the substrate 100, by using the second gate 124 as a mask, to form a second LDD 132.

Referring to FIG. 1E, a second spacer 128 is formed on the second sidewall of the second gate 124. The second spacer 128 can be made of a material different from that of the first spacer 114. Moreover, the second spacer 128 may have a thickness different from that of the first spacer 114. These can be achieved because the first spacer 114 is capped with the second dielectric layer 122 when the second spacer 128 is formed.

Referring to FIG. 1F, after the second spacer 128 has been formed, ions are third implanted into the second region 120 of the substrate 100, by using the second spacer 128 and the second gate 124 as a mask, to form a doped region (source/drain region) 134 deeper than the second LDD 132. Thereafter, a second silicide layer 126 is grown on the second gate 124 and on the third doped region 134 (or the second LDD 132). The second silicide layer 126 can be a titanium silicide ($TiSi_2$) layer or a cobalt silicide ($CoSi_2$) layer.

This present invention has at least the following advantages:

1. The process of fabricating the memory device is independent from the process of fabricating the logic device. For example, self-aligned contact process (SAC) of the memory device can be performed by a conventional method without consideration for the process of defining the logic device.

2. The second spacer can be made of a material different from that of the first spacer. Moreover, the second spacer may have a thickness different from that of the first spacer. These can be achieved because the first spacer is capped with the second dielectric layer when the second spacer is formed.

Although specific embodiments have been illustrated and described, it will be obvious to those skilled in the art that various modifications may be made without departing from the spirit which is intended to be limited solely by the appended claims.

What is claimed is:

1. A method of fabricating a memory device and a logic device on a chip, wherein the memory device has a first gate with a first sidewall, and wherein the logic device has a second gate with a second sidewall, the method comprising the steps of:

providing a substrate;

providing a first region of the substrate, to be used for the memory device;

providing a second region of the substrate, to be used for the logic device;

sequentially forming a first dielectric layer, a polysilicon layer, a first silicide layer, and a hard mask layer over the first and the second regions of the substrate;

patterning the hard mask layer, the first silicide layer, the polysilicon layer and the first dielectric layer, over the first region of the substrate, to form the first gate;

first implanting ions into the first region of the substrate, by using the first gate as a mask, to form a first doped region;

forming a first spacer on the first sidewall of the first gate;

partially covering the substrate by forming a second dielectric layer to cap the first gate and the first doped region over the first region of the substrate, and to expose the hard mask layer over the second region of the substrate;

removing the hard mask layer and the first silicide layer over the second region of the substrate;

patterning the polysilicon layer over the second region of the substrate, to form the second gate;

second implanting ions into the second region of the substrate, by using the second gate as a mask, to form a second doped region;

forming a second spacer on the second sidewall of the second gate;

third implanting ions into the second region of the substrate, by using the second spacer and the second gate as a mask, to form a third doped region deeper than the second doped region; and growing a second silicide layer on the second gate and on the third doped region.

2. The method of claim 1, wherein the formation of the second dielectric layer further comprises:

depositing an oxide layer over the substrate; and patterning the oxide layer to partially removing the oxide layer, so that the first gate, the first spacer and the first region of the substrate are capped with the oxide layer, and so that the hard mask layer over the second region of the substrate is exposed.

3. The method of claim 1, wherein the first spacer and the second spacer are made of different materials, respectively.

4. The method of claim 1, wherein the first spacer has a thickness different from that of the second spacer.

5. The method of claim 1, wherein the first silicide layer is a tungsten silicide (WSi) layer.

6. The method of claim 1, wherein the second silicide layer is a titanium silicide ($TiSi_2$) layer.

7. The method of claim 1, wherein the second silicide layer is a cobalt silicide ($COSi_2$) layer.

8. A method of fabricating a memory device and a logic device on a substrate, wherein the memory device has a first gate on a first region of the substrate, and wherein the logic device has a second gate with a sidewall on a second region of the substrate, the method comprising the steps of:

sequentially forming a conductive layer and a first silicide layer over the first and the second regions of the substrate;

patterning the first silicide layer and the conductive layer, over the first region of the substrate, to form the first gate;

first implanting ions into the first region of the substrate, by using the first gate as a mask, to form a first doped region;

forming a dielectric layer to cap the first gate, the first doped region and the first region of the substrate;

removing the first silicide layer over the second region of the substrate;

patterning the conductive layer over the second region of the substrate, to form the second gate;

second implanting ions into the second region of the substrate, by using the second gate as a mask, to form a second doped region;

forming a spacer on the sidewall of the second gate;

third implanting ions into the second region of the substrate, by using the second gate and the spacer as a mask, to form a third doped region deeper than the second doped region; and forming a second silicide layer on the second gate and on the third doped region.

9. The method of claim 8, wherein the conductive layer comprises polysilicon.

10. The method of claim 8, wherein the formation of the dielectric layer further comprises:

depositing an oxide layer over the substrate; and patterning the oxide layer to partially removing the oxide layer, thereby leaving a portion of the oxide layer capping the first gate and the first region of the substrate.

11. A method of fabricating a memory device and a logic device on a substrate, wherein the memory device has a first gate on a first region of the substrate, and wherein the logic device has a second gate with a sidewall on a second region of the substrate, the method comprising the steps of:

sequentially forming a conductive layer and a first silicide layer over the first and the second regions of the substrate;

patterning the first silicide layer and the conductive layer, over the first region of the substrate, to form the first gate;

first implanting ions into the first region of the substrate, by using the first gate as a mask, to form a first doped region;

forming a dielectric layer to cap the first gate, the first doped region and the first region of the substrate:

removing the first silicide layer over the second region of the substrate;

patterning the conductive layer over the second region of the substrate, to form the second gate; and second implanting ions into the second region of the substrate, by using the second gate as a mask, to form a second doped region.

12. The method of claim 11, after the second implanting step, further comprising a step of forming a spacer on the sidewall of the second gate.

13. The method of claim 12, after the spacer forming step, further comprising a step of third implanting ions into the second region of the substrate, by using the second gate and the spacer as a mask, to form a third doped region deeper than the second doped region.

14. The method of claim 13, after the third implanting step, further comprising a step of forming a second silicide layer on the second gate and on the third doped region.

15. The method of claim 14, wherein the silicide layer is a titanium silicide ($TiSi_2$) layer.

16. The method of claim 14, wherein the silicide layer is a cobalt silicide ($CoSi_2$) layer.

17. The method of claim 11, wherein the conductive layer comprises polysilicon.

18. The method of claim 11, wherein the formation of the dielectric layer further comprises:

depositing an oxide layer over the substrate; and patterning the oxide layer to partially removing the oxide layer, thereby leaving a portion of the oxide layer capping the first gate and the first region of the substrate.

* * * * *